(12) United States Patent
Su et al.

(10) Patent No.: US 10,455,739 B2
(45) Date of Patent: Oct. 22, 2019

(54) HIGH-FREQUENCY CONNECTING DEVICE WITH ENHANCED COOLING EFFICIENCY OF OPTICAL MODULE

(71) Applicant: NEXTRONICS ENGINEERING CORP., New Taipei (TW)

(72) Inventors: Hou-An Su, Keelung (TW); Chang-Kai Chao, Taipei (TW)

(73) Assignee: NEXTRONICS ENGINEERING CORP., New Taipei (TW)

( * ) Notice: Subject to any disclaimer, the term of this patent is extended or adjusted under 35 U.S.C. 154(b) by 0 days.

(21) Appl. No.: 15/995,761

(22) Filed: Jun. 1, 2018

(65) Prior Publication Data

US 2019/0215989 A1 Jul. 11, 2019

(30) Foreign Application Priority Data

Jan. 10, 2018 (TW) .............................. 107100929 A (51) Int. Cl.
*H05K 7/20* (2006.01)
*G02B 27/00* (2006.01)
*H01R 13/646* (2011.01)
*H05K 5/03* (2006.01)

(52) U.S. Cl.
CPC ..... *H05K 7/20509* (2013.01); *G02B 27/0012* (2013.01); *H01R 13/646* (2013.01); *H05K 5/03* (2013.01)

(58) Field of Classification Search
CPC .. H05K 7/20509; H05K 5/03; H05K 7/20154; H05K 7/2039; H05K 7/20409; H05K 7/20418; H05K 7/20436; H05K 7/20854; H05K 7/209; H05K 7/20963; H01R 13/646; G02B 27/0012; G06F 1/20; G06F 2200/201; H01L 23/40; H01L 23/3675
USPC .............. 361/679.52, 697.54, 701, 702, 709
See application file for complete search history.

(56) References Cited

U.S. PATENT DOCUMENTS

| 9,910,231 | B2* | 3/2018 | Kelty ................... G02B 6/4269 |
| 2006/0291171 | A1* | 12/2006 | Ahrens ................ G02B 6/4292 361/716 |
| 2007/0183128 | A1* | 8/2007 | Pirillis ............... H05K 7/20418 361/715 |
| 2008/0019100 | A1* | 1/2008 | Yang .................... H05K 9/0058 361/716 |

(Continued)

*Primary Examiner* — Anatoly Vortman
*Assistant Examiner* — Stephen S Sul
(74) *Attorney, Agent, or Firm* — Li & Cai Intellectual Property (USA) Office (57) ABSTRACT

A high-frequency connecting device includes a housing, a sandwiched member, an inner heat sink, a rear heat sink, a heat pipe, a upper heat sink and a connector. The inner heat sink is disposed inside the sandwiched member. The top and the bottom of the inner heat sink respectively have a first contact portion and a second contact portion. The upper heat sink has a third contact portion. A fourth contact portion is elastically disposed on the lower cover. The first and the second optical modules are respectively inserted into the upper and the lower spaces. The top and the bottom of the first optical module are in direct contact respectively with the third contact portion and the first contact portion, while the top and the bottom of the second optical module are in direct contact respectively with the second contact portion and the fourth contact portion.

9 Claims, 9 Drawing Sheets

(56) References Cited

U.S. PATENT DOCUMENTS

| | | | |
|---|---|---|---|
| 2008/0285236 A1* | 11/2008 | Phillips | G02B 6/4246 |
| | | | 361/709 |
| 2012/0058670 A1* | 3/2012 | Regnier | H01R 13/6586 |
| | | | 439/485 |
| 2014/0160679 A1* | 6/2014 | Kelty | H05K 7/20672 |
| | | | 361/700 |
| 2014/0302713 A1* | 10/2014 | Su | H01R 12/7082 |
| | | | 439/607.35 |
| 2015/0013936 A1* | 1/2015 | Mack | F28D 15/0275 |
| | | | 165/53 |
| 2015/0029667 A1* | 1/2015 | Szczesny | F28D 15/0275 |
| | | | 361/700 |
| 2016/0093996 A1* | 3/2016 | Phillips | H01R 24/60 |
| | | | 439/487 |
| 2016/0197424 A1* | 7/2016 | L'Esperance | H01R 12/721 |
| | | | 439/61 |

* cited by examiner

HIGH-FREQUENCY CONNECTING DEVICE WITH ENHANCED COOLING EFFICIENCY OF OPTICAL MODULE

BACKGROUND

1. Technical Field

The present disclosure is related to a high-frequency connecting device, and more particularly, to a high-frequency connecting device with enhanced cooling efficiency of optical module.

2. Description of Related Art

The existing high frequency connector can be disposed inside the housing (female end), and the optical module can be inserted inside the housing (male end) so that an electrical connection between the optical module and the high frequency connector is achieved when plugged into one another. The existing method for a high-frequency connecting device is to provide upper heat sinks on the top of the housing. When the optical module is inserted into the interior of the housing, the upper heat sinks may be used to contact the optical module to assist the heat dissipation of the optical module. However, since only the upper heat sinks are used to assist heat dissipation, the heat dissipation efficiency is rather poor. Moreover, as the existing pluggable mechanism of the optical module is located inside the housing, the optical module cannot make effective contact with the heat sinks, resulting in poor heat dissipation efficiency. In addition, as the existing thermal conduction methods involve many media and thermal resistance, the high temperature of the optical module cannot be efficiently conducted to the upper heat sinks due to excessive heat loss.

SUMMARY OF THE DISCLOSURE

An object of the present invention is to provide a high-frequency connecting device with enhanced cooling efficiency of optical module. By reducing the occurrence of thermal resistance and accelerating the heat dissipation capability, the high temperature of an optical module is efficiently transmitted to each heat sink.

In one aspect/configuration of a high-frequency connecting device with enhanced cooling efficiency of optical module according to the present disclosure, the high-frequency connecting device includes a housing, a sandwiched member, an inner heat sink, a rear heat sink, a heat pipe, a upper heat sink, and a connector. The housing has an upper cover, two side walls and a lower cover. An accommodating space is formed between the upper cover, the two side walls and the lower cover. The sandwiched member is disposed in the accommodating space and is configured to partition the accommodating space into an upper space and a lower space. The inner heat sink is disposed inside the sandwiched member. The top and the bottom of the inner heat sink respectively have a first contact portion and a second contact portion. The first contact portion and the second contact portion respectively are exposed to the upper space and the lower space. The rear heat sink is disposed behind the housing. The heat pipe is connected between the inner heat sink and the rear heat sink. The upper heat sink is disposed on the upper cover of the housing. The bottom of the upper heat sink has a third contact portion protruding therefrom. The third contact portion is exposed at the upper space. A fourth contact portion is elastically disposed on the lower cover of the housing and is exposed at the bottom of the lower space. The connector is disposed inside the housing and is configured to plug in a first optical module and a second optical module. The first optical module and the second optical module are respectively inserted into the upper space and the lower space for plugging in the connector. The top and the bottom of the first optical module are in direct contact respectively with the third contact portion and the first contact portion, while the top and the bottom of the second optical module are in direct contact respectively with the second contact portion and the fourth contact portion.

In order to further appreciate the characteristics and technical contents of the present disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

First Embodiment

Referring to FIG. 1 to FIG. 4, the present invention provides a high-frequency connecting device with enhanced cooling efficiency of optical module, which is a stacked structure and can be of different specifications such as 2×1, 2×2, 2×3, 2×4, and 2×5, and is not limited thereto. The present embodiment adopts the 2×3 specification, but only the structure part of the 2×1 specification will be described herein. The high-frequency connecting device includes a housing 1, a sandwiched member 2, an inner heat sink 3, a heat pipe 4, a rear heat sink 5, and an upper heat sink 6.

Figure 1:
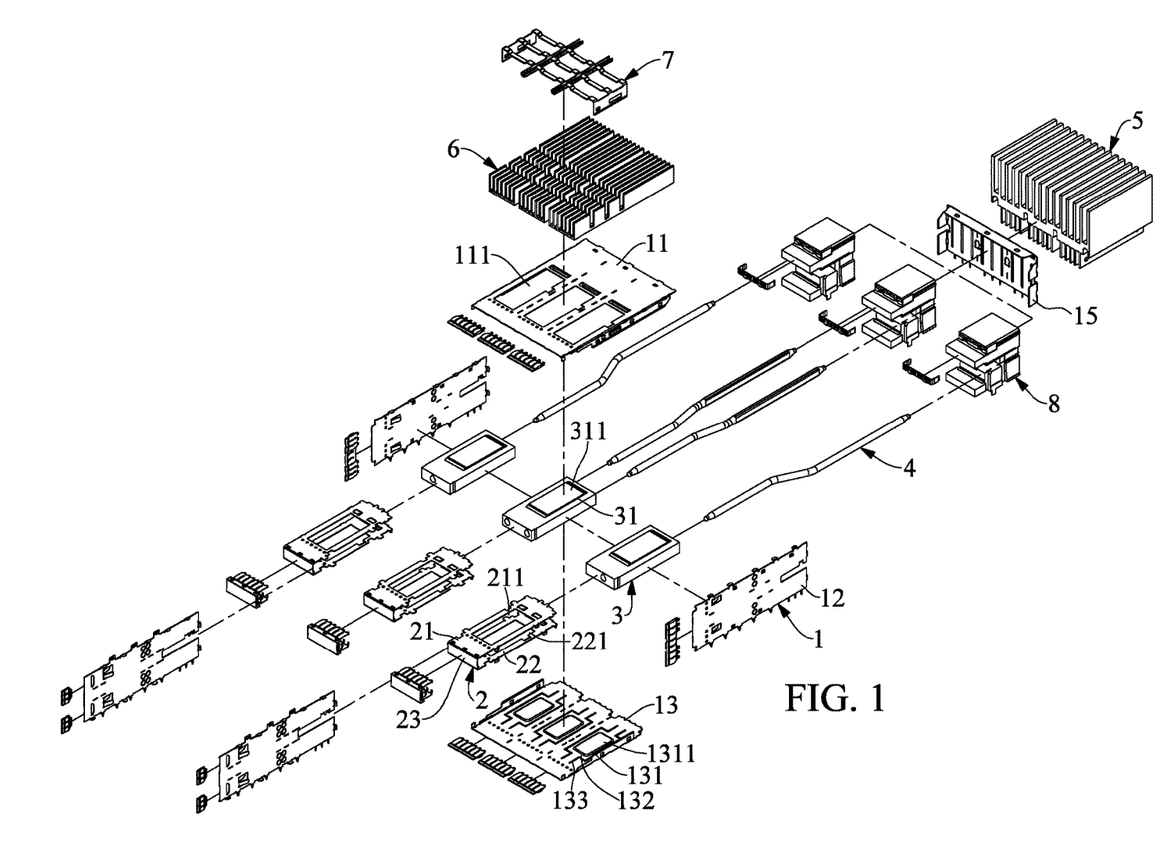
FIG. 1 shows an exploded view of a high-frequency connecting device with enhanced cooling efficiency of optical module according to the present disclosure.
Figure 2:
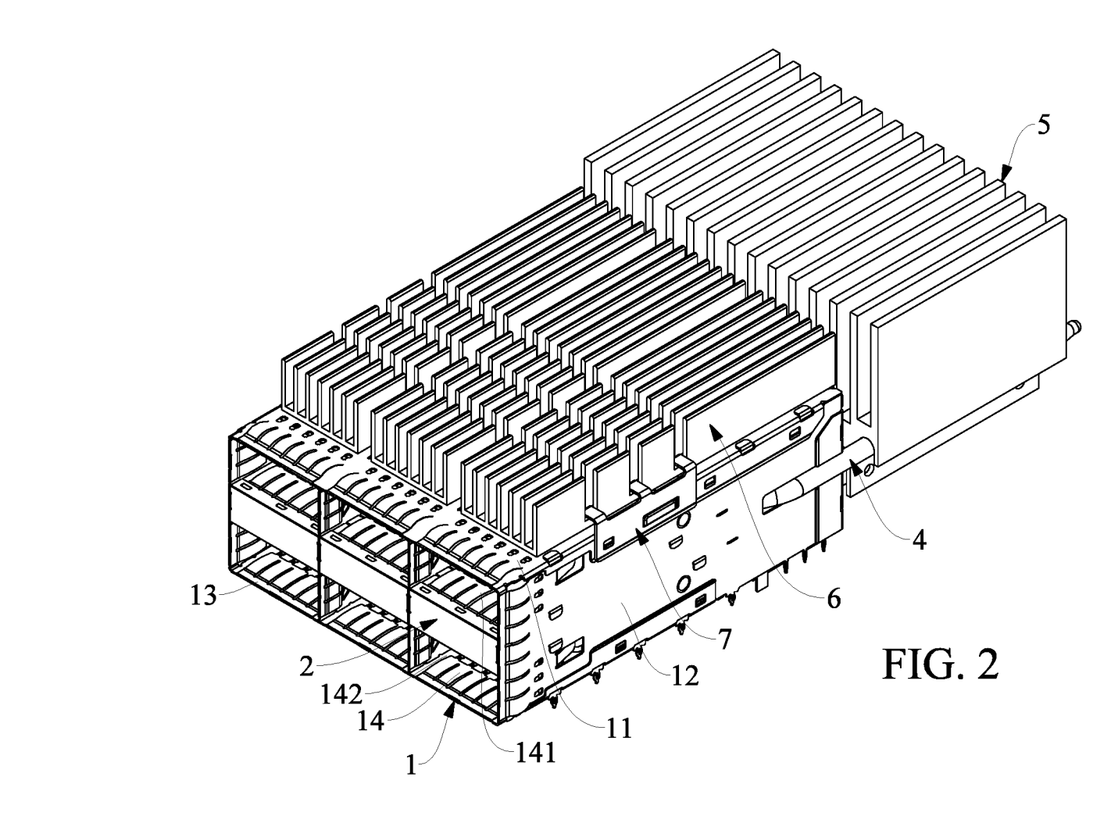
FIG. 2 shows a perspective view of a high-frequency connecting device with enhanced cooling efficiency of optical module according to the present disclosure.
Figure 3:
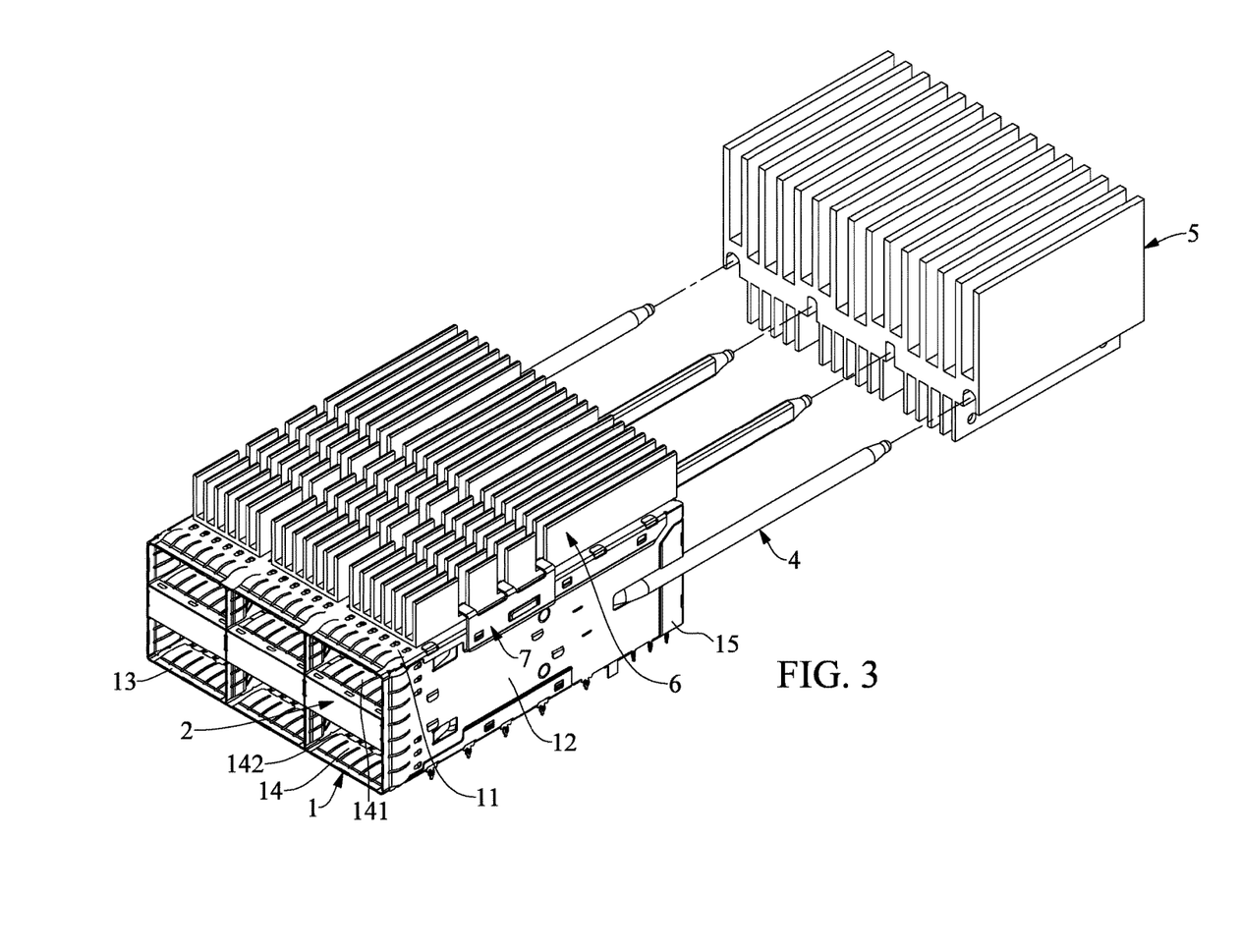
FIG. 3 shows another perspective view of a high-frequency connecting device with enhanced cooling efficiency of optical module according to the present disclosure.
Figure 5:
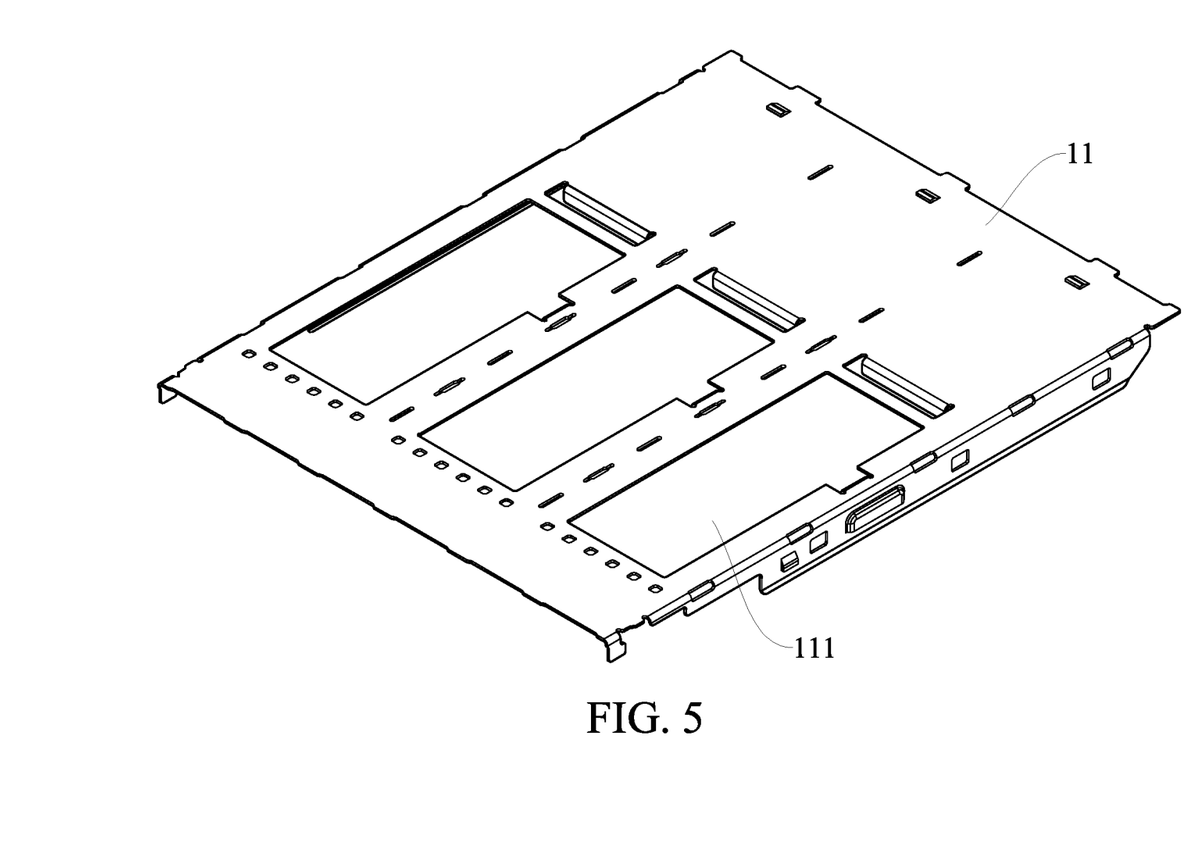
FIG. 5 shows a perspective view of an upper cover of a high-frequency connecting device with enhanced cooling efficiency of optical module according to the present disclosure.
Figure 6:
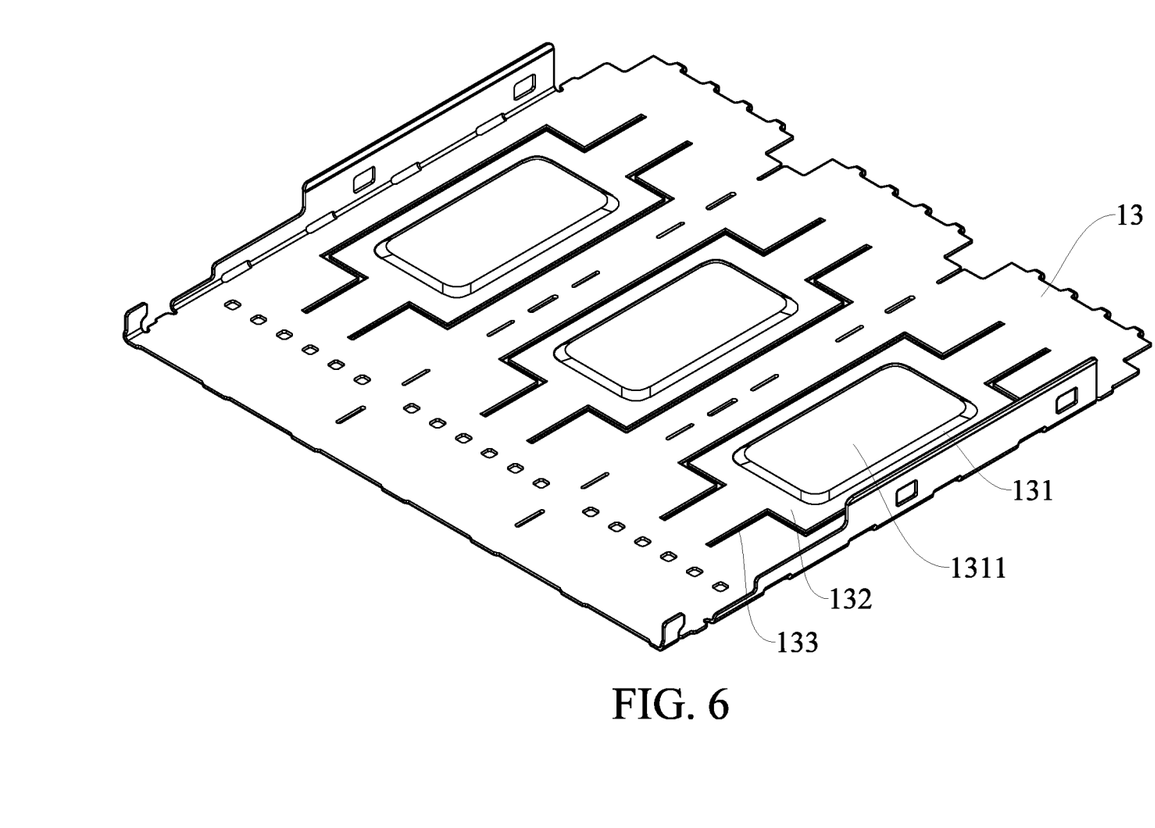
FIG. 6 shows a perspective view of a lower cover of a high-frequency connecting device with enhanced cooling efficiency of optical module according to the present disclosure.

The housing 1 is a metal shell and includes an upper cover 11, two side walls 12 and a lower cover 13 (as shown in FIG. 5 and FIG. 6). The upper cover 11, the two side walls 12 and the lower cover 13 can be rectangular metal plate bodies. The two side walls 12 are connected between the upper cover 11 and the lower cover 13, and an accommodating space 14 is formed between the upper cover 11, the two side walls 12 and the lower cover 13, so as to form a housing 1 with an open front end. In this embodiment, the housing 1 can further include a rear cover 15 disposed at the rear end thereof (as shown in FIG. 1 and FIG. 3).

Figure 7:
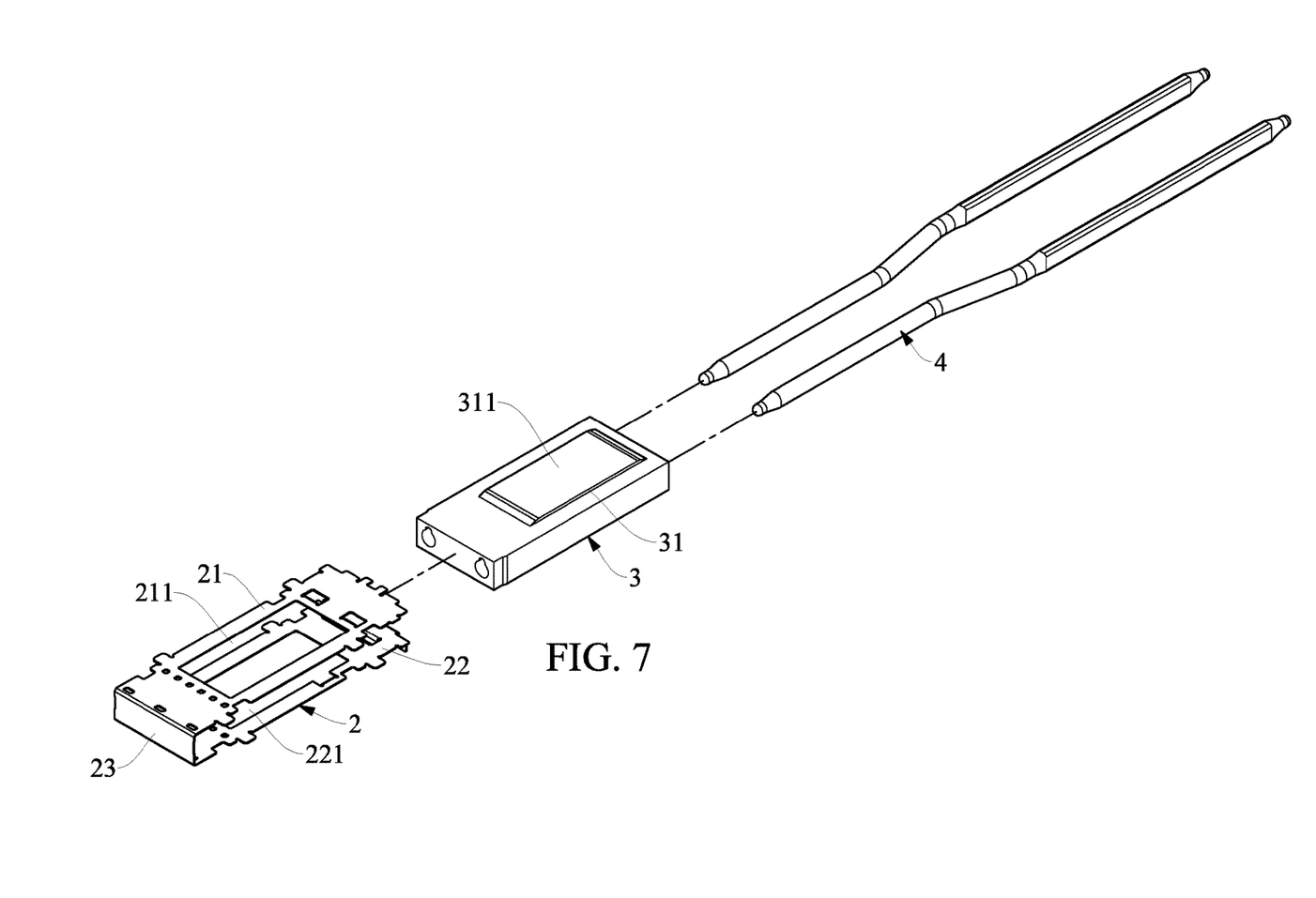
FIG. 7 shows a perspective view of a sandwiched member, an inner heat sink and a heat pipe of a high-frequency connecting device with enhanced cooling efficiency of optical module according to the present disclosure.

The sandwiched member 2 is formed of a metal plate body and is bent in a U-shape. That is, the sandwiched member 2 may have an upper plate body 21, a lower plate body 22 and a front plate body 23 (see FIG. 7). The upper plate body 21, the lower plate body 22, and the front plate body 23 may all have a rectangular shape. The upper plate body 21 and the lower plate body 22 are spaced at intervals and parallel to each other, and the front plate body 23 is connected between the front end of the upper plate body 21 and the front end of the lower plate body 22. The upper plate body 21 and the lower plate body 22 can be respectively provided with an upper through hole 211 and a lower through hole 221. Both the upper through hole 211 and the lower through hole 221 can be rectangular in shape. The sandwiched member 2 is disposed in the accommodating space 14. That is, the sandwiched member 2 can be disposed at a middle height of the accommodating space 14. The two sides of the sandwiched member 2 can be fixed to the two sidewalls 12 of the housing 1 by means of snapping or welding. The sandwiched member 2 is used to partition the accommodating space 14 into an upper space 141 and a lower space 142.

The inner heat sink 3 is made of a metal material with good thermal conductivity, such as aluminum or copper. The inner heat sink 3 is preferably a rectangular block, but the shape of the inner heat sink 3 is not limited. The inner heat sink 3 is disposed inside the sandwiched member 2. That is, the inner heat sink 3 can be disposed between the upper plate body 21 and the lower plate body 22 of the sandwiched member 2. The top and the bottom of the inner heat sink 3 respectively have a first contact portion 31 and a second contact portion 32. The first contact portion 31 and the second contact portion 32 respectively protrude from the top and the bottom of the inner heat sink 3. The first contact portion 31 and the second contact portion 32 respectively have a first contact surface 311 and a second contact surface 321 (see FIG. 4). Both the first contact surface 311 and the second contact surface 321 are smooth planes. The first contact portion 31 and the second contact portion 32 respectively correspond to the upper through hole 211 and the lower through hole 221 so that the first contact portion 31 and the second contact portion 32 are respectively exposed to the upper space 141 and the lower space 142. That is, the first contact portion 31 can be exposed at the bottom of the upper space 141, and the second contact portion 32 can be exposed at the top of the lower space 142.

The rear heat sink 5 is made of a metal material with good thermal conductivity such as aluminum or copper, and the shape of the rear heat sink 5 is not limited. The rear heat sink 5 is disposed behind the housing 1 and can be spaced at intervals. The heat pipe 4 is connected between the inner heat sink 3 and the rear heat sink 5. One or more heat pipes 4 may be provided, but at least one is required. The number of heat pipes 4 is not limited. The front end of the heat pipe 4 is connected to the inner heat sink 3 in such a manner that it is inserted inside or on both sides of the inner heat sink 3, while the rear end of the heat pipe 4 is connected to the rear heat sink 5 in such a manner that it is inserted inside or on both sides of the rear heat sink 5. The rear end of the heat pipe 4 can also be connected to the upper portion or the lower portion of the rear heat sink 5. Therefore, the high temperature of the optical module can be transmitted to the rear heat sink 5 through the inner heat sink 3 and the heat pipe 4 in sequence.

The upper heat sink 6 is made of a metal material with good thermal conductivity such as aluminum or copper, and the shape of the upper heat sink 6 is not limited. The upper heat sink 6 is disposed on the upper cover 11 of the housing 1 and is fixed by an elastic fastener 7 to allow for flexible installation. The elastic fastener 7 has no structural limitation, and various types of existing elastic fasteners can be used.

Figure 8:
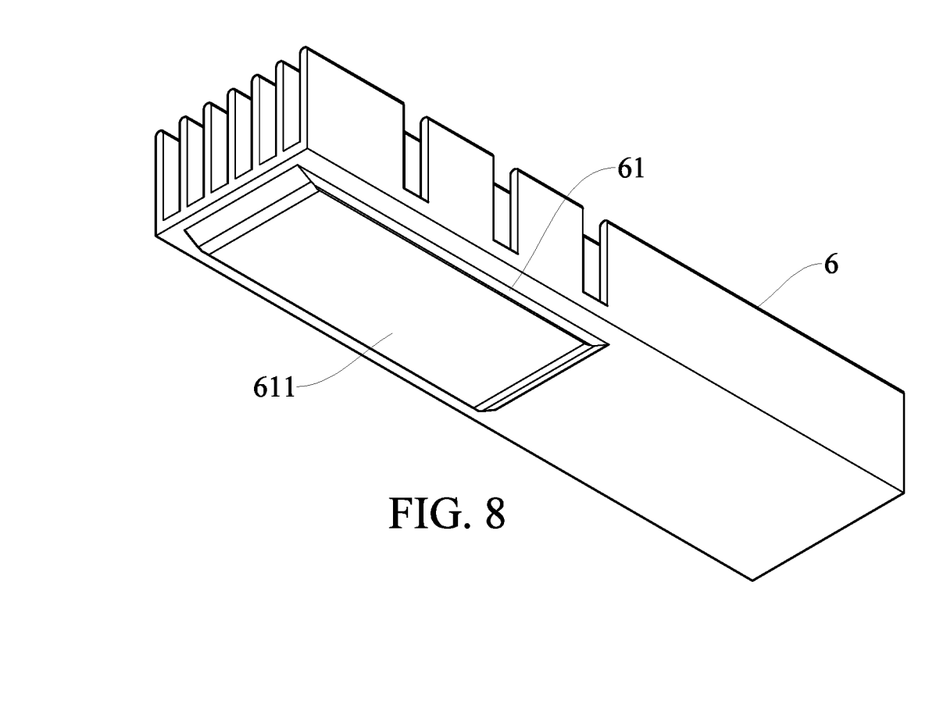
FIG. 8 shows a perspective view of an upper heat sink of a high-frequency connecting device with enhanced cooling efficiency of optical module according to the present disclosure.

The bottom of the upper heat sink 6 has a third contact portion 61 (see FIG. 8) which protrudes from the bottom of the upper heat sink 6. The third contact portion 61 has a third contact surface 611 which is a smooth plane. In the present embodiment, the upper cover 11 of the housing 1 is provided with a top through hole 111, which may have a rectangular shape. The third contact portion 61 corresponds to the top through hole 111 and exposes the third contact portion 61 to the upper space 141. That is, the third contact portion 61 can be exposed at the top of the upper space 141. The upper heat sink 6 is fixed to the upper cover 11 of the housing 1 with the elastic fastener 7 so that the third contact portion 61 of the upper heat sink 6 can have an elastic downward pressure.

A fourth contact portion 131 is elastically disposed on the lower cover 13 of the housing 1 and protrudes from the top of the lower cover 13. The fourth contact portion 131 has a fourth contact surface 1311 which is a smooth plane. The fourth contact portion 131 is exposed in the lower space 142. That is, the fourth contact portion 131 can be exposed at the bottom of the lower space 142. In the present embodiment, the fourth contact portion 131 has a convex platform shape, and the lower cover 13 of the housing 1 has an elastic piece 132. The fourth contact portion 131 is disposed on top of the elastic piece 132 so that the fourth contact portion 131 of the lower cover 13 can have an elastic upward force. In this embodiment, the opposite sides of the elastic piece 132 are provided with a groove 133 so that the opposite sides of the elastic piece 132 are separated from the lower cover 13. The opposite sides of the elastic piece 132 are connected to the lower cover 13 so that the fourth contact portion 131 can be elastically disposed on the lower cover 13 through the elastic piece 132. The first contact surface 311, the second contact surface 321, the third contact surface 611 and the fourth contact surface 1311 are all smooth planes and parallel to each other. The degrees of surface roughness of the first contact surface 311, the second contact surface 321, the third contact surface 611, and the fourth contact surface 1311 are all less than Ra1 μm.

Figure 4:
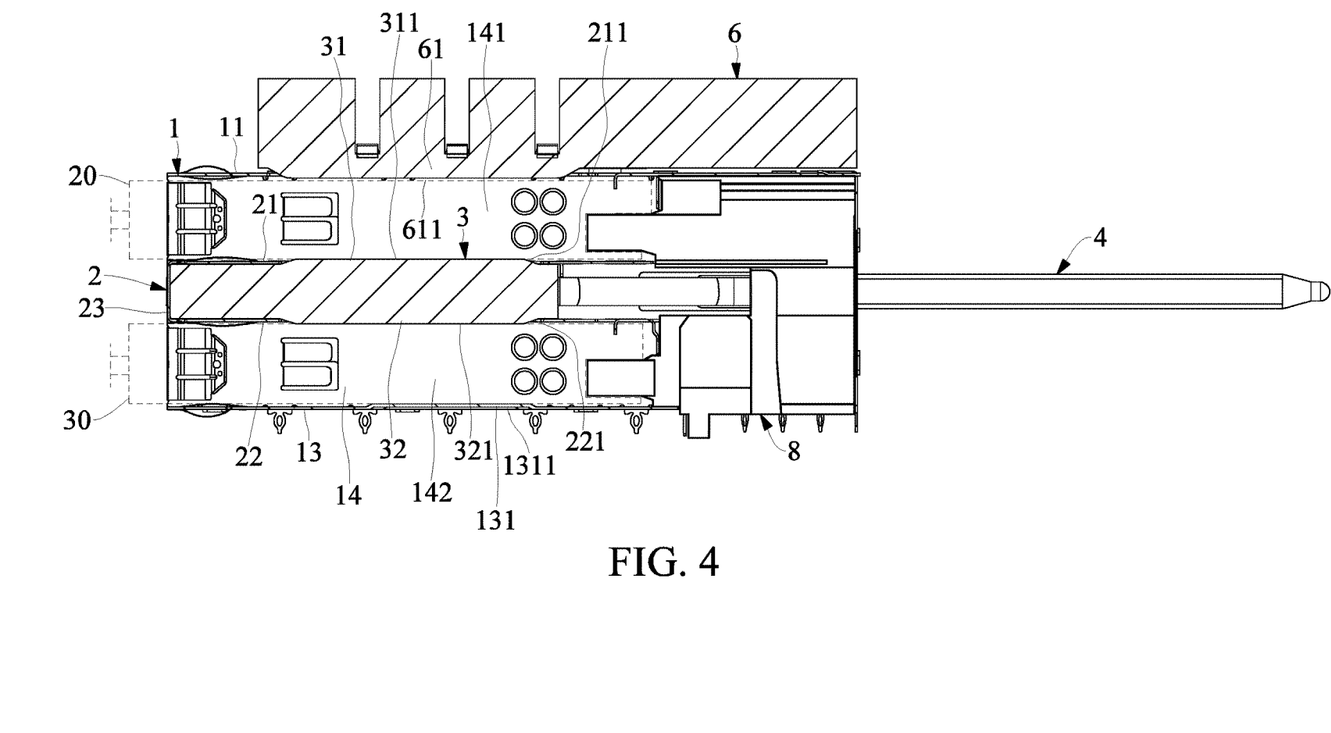
FIG. 4 shows a cross-sectional view of a high-frequency connecting device with enhanced cooling efficiency of optical module according to the present disclosure.

The high-frequency connecting device also includes a connector 8 disposed inside the housing 1. The connector 8 is a double-layer electrical connector that can be used to plug in the first optical module 20 and the second optical module 30 (as shown in FIG. 4). The first optical module 20 and the second optical module 30 are respectively inserted into the upper space 141 and the lower space 142 for plugging in the connector 8. The top and the bottom of the first optical module 20 are in direct contact respectively with the third contact portion 61 (the third contact surface 611) and the first contact portion 31 (the first contact surface 311), while the top and the bottom of the second optical module 30 are in direct contact respectively with the second contact portion 32 (the second contact surface 321) and the fourth contact portion 131 (the fourth contact surface 1311). In this way, the device can reduce the occurrence of thermal resistance and accelerate the heat dissipation, so as to facilitate the heat dissipation of the first optical module 20 and the second optical module 30.

Second Embodiment

Figure 9:
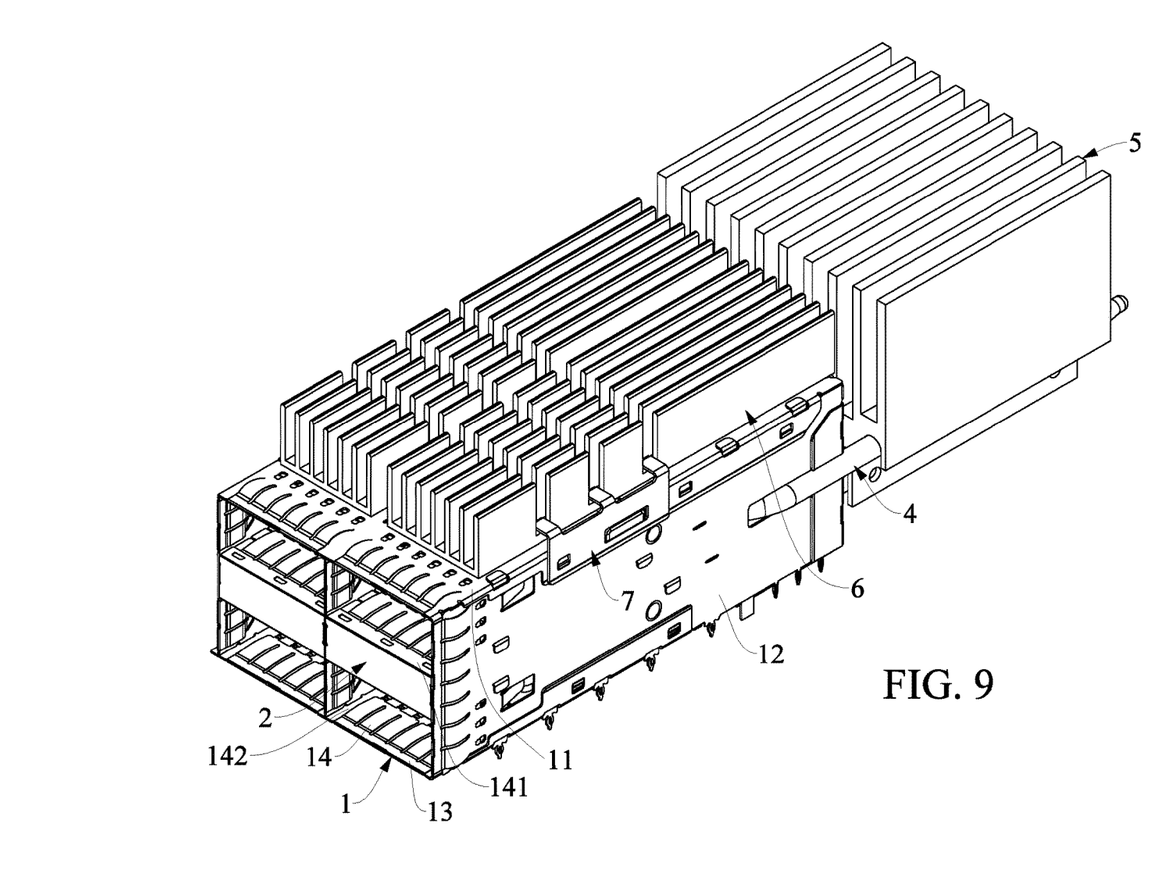
FIG. 9 shows a perspective view of a high-frequency connecting device with enhanced cooling efficiency of optical module according to another embodiment of the present disclosure.

Referring to FIG. 9, the present embodiment discloses a high-frequency connecting device in 2×2 specification. The structure thereof is substantially the same as the above-mentioned embodiment, and therefore needs not to be further described in detail.

In summary, the high-frequency connecting device of the present invention enables the high temperature of the first optical module and the second optical module to be efficiently transmitted to the heat sinks such as the inner heat sink, the rear heat sink, and the upper heat sink. The first optical module and the second optical module can be stably clamped and fixed between the inner heat sink, the upper heat sink, and the lower cover by the elastic downward pressure of the third contact portion of the upper heat sink and the elastic upward force of the fourth contact portion of the lower cover. In this way, the first optical module and the second optical module can be in effective contact with the inner heat sink, the upper heat sink and the lower cover, thereby reducing the occurrence of thermal resistance and accelerating the heat dissipation, so that the high temperature of the first optical module and the second optical module can be transmitted to the rear heat sink through the inner heat sink and the heat pipe.

The descriptions illustrated supra set second simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A high-frequency connecting device with enhanced cooling efficiency of optical module, comprising:
    a housing having an upper cover, two side walls and a lower cover, and an accommodating space being formed between the upper cover, the two side walls and the lower cover;
    a sandwiched member disposed in the accommodating space and partitioning the accommodating space into an upper space and a lower space;
    an inner heat sink disposed inside the sandwiched member, a top and a bottom of the inner heat sink respectively having a first contact portion and a second contact portion, and the first contact portion and the second contact portion respectively exposed to the upper space and the lower space;
    a rear heat sink disposed behind the housing;
    a heat pipe connected between the inner heat sink and the rear heat sink;
    a upper heat sink disposed on the upper cover of the housing, a bottom of the upper heat sink having a third contact portion protruding therefrom, the third contact portion exposed at the upper space, and a fourth contact portion elastically disposed on the lower cover of the housing and exposed at a bottom of the lower space; and
    a connector disposed inside the housing and configured to plug in a first optical module and a second optical module;
    wherein the first optical module and the second optical module are respectively inserted into the upper space and the lower space for plugging in the connector, and a top and a bottom of the first optical module are in direct contact respectively with the third contact portion and the first contact portion, while a top and a bottom of the second optical module are in direct contact respectively with the second contact portion and the fourth contact portion.

2. The high-frequency connecting device with enhanced cooling efficiency of optical module according to claim 1, wherein the sandwiched member has an upper plate body, a lower plate body and a front plate body, the upper plate body and the lower plate body are spaced at intervals and parallel to each other, the front plate body is connected between a front end of the upper plate body and a front end of the lower plate body, and the inner heat sink is disposed between the upper plate body and the lower plate body of the sandwiched member.

3. The high-frequency connecting device with enhanced cooling efficiency of optical module according to claim 2, wherein the upper plate body and the lower plate body are respectively provided with an upper through hole and a lower through hole, and the first contact portion and the second contact portion respectively correspond to the upper through hole and the lower through hole.

4. The high-frequency connecting device with enhanced cooling efficiency of optical module according to claim 1, the first contact portion and the second contact portion respectively protrude from the top and the bottom of the inner heat sink, and the first contact portion and the second contact portion respectively have a first contact surface and a second contact surface.

5. The high-frequency connecting device with enhanced cooling efficiency of optical module according to claim 4, wherein the third contact portion protrudes from the bottom of the upper heat sink, and the third contact portion has a third contact surface, the fourth contact portion protrudes from a top of the lower cover, and the fourth contact portion has a fourth contact surface, the top and the bottom of the first optical module are in direct contact respectively with the third contact surface and the first contact surface, the top and the bottom of the second optical module are in direct contact respectively with the second contact surface and the fourth contact surface.

6. The high-frequency connecting device with enhanced cooling efficiency of optical module according to claim 5, wherein the first contact surface, the second contact surface, the third contact surface and the fourth contact surface are all smooth planes and parallel to each other, and the degrees of surface roughness of the first contact surface, the second contact surface, the third contact surface, and the fourth contact surface are all less than Ra1 μm.

7. The high-frequency connecting device with enhanced cooling efficiency of optical module according to claim 1, wherein the upper cover of the housing is provided with a top through hole, and the third contact portion corresponds to the top through hole.

8. The high-frequency connecting device with enhanced cooling efficiency of optical module according to claim 1, wherein the fourth contact portion has a convex platform shape, and the lower cover of the housing has an elastic piece, the fourth contact portion is disposed on the elastic piece, and opposite sides of the elastic piece are provided with a groove such that the opposite sides of the elastic piece are separated from the lower cover, and other opposite sides of the elastic piece are connected to the lower cover, and the fourth contact portion is elastically disposed on the lower cover through the elastic piece.

9. The high-frequency connecting device with enhanced cooling efficiency of optical module according to claim 1, wherein the upper heat sink is fixed to the upper cover of the housing with an elastic fastener.

* * * * *